(12) United States Patent
Hatori

(10) Patent No.: US 8,729,526 B2
(45) Date of Patent: May 20, 2014

(54) OPTICAL SEMICONDUCTOR DEVICE AND METHOD OF MANUFACTURING OPTICAL SEMICONDUCTOR DEVICE

(75) Inventor: Nobuaki Hatori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 586 days.

(21) Appl. No.: 12/965,588

(22) Filed: Dec. 10, 2010

(65) Prior Publication Data
US 2011/0140084 A1 Jun. 16, 2011

(30) Foreign Application Priority Data

Dec. 14, 2009 (JP) .................................. 2009-282705

(51) Int. Cl.
H01L 29/06 (2006.01)

(52) U.S. Cl.
USPC ........ 257/17; 257/E29.071; 438/47; 438/962; 977/774

(58) Field of Classification Search
USPC ............. 257/17, E29.071, E29.078, E21.089; 438/47, 962; 977/774
See application file for complete search history.

(56) References Cited

U.S. PATENT DOCUMENTS

| 5,060,030 | A * | 10/1991 | Hoke | 257/194 |
|---|---|---|---|---|
| 6,294,794 | B1 * | 9/2001 | Yoshimura et al. | 257/14 |
| 7,015,498 | B2 | 3/2006 | Ebe et al. | |
| 7,456,422 | B2 | 11/2008 | Uetake et al. | |

FOREIGN PATENT DOCUMENTS

| JP | 2000-114665 | | 4/2000 |
|---|---|---|---|
| JP | 2004-111710 | A | 4/2004 |
| JP | 2006-245373 | A | 9/2006 |
| JP | 2008-091420 | | 4/2008 |

OTHER PUBLICATIONS

Nami, Yasuoka et al.,"1.55-μm Polarization-Insensitive Quantum Dot Semiconductor Optical Amplifier", ECOC 2008, Sep. 21-25, 2008, Brussels, Belgium, Th.1.C.1, Sep. 21, 2008, vol. 4-17, 18.
"Japanese Office Action" mailed by JPO and corresponding to Japanese application No. 2009-282705 on Aug. 20, 2013, with partial English translation.
Japanese Office Action mailed by JPO and corresponding to Japanese application No. 2009-282705 on Jan. 21, 2014, with partial English translation.

* cited by examiner

*Primary Examiner* — Colleen Matthews
*Assistant Examiner* — Colleen E Snow
(74) *Attorney, Agent, or Firm* — Fujitsu Patent Center

(57) ABSTRACT

An optical semiconductor device includes a substrate; and an active layer disposed on the substrate, wherein the active layer includes a first barrier layer containing GaAs, a quantum dot layer, which is disposed on the first barrier layer, which includes a quantum dot containing InAs, which includes a side barrier layer which covers at least a part of the quantum dot and a side surface of the quantum dot, and having an elongation strain inherent therein, and a second barrier layer disposed on the quantum dot layer.

15 Claims, 13 Drawing Sheets

OPTICAL SEMICONDUCTOR DEVICE AND METHOD OF MANUFACTURING OPTICAL SEMICONDUCTOR DEVICE

CROSS-REFERENCE TO RELATED APPLICATIONS

This application is based upon and claims the benefit of priority of the prior Japanese Patent Application No. 2009-282705, filed on Dec. 14, 2009, the entire contents of which are incorporated herein by reference.

FIELD

The disclosure generally relates to an optical semiconductor device by using a quantum dot and a method of manufacturing the optical semiconductor device.

BACKGROUND

A semiconductor optical amplifier (SOA) disposed on a GaAs substrate and provided with an active layer including a quantum dot has excellent characteristics, e.g., a high temperature characteristic and a high saturation optical output characteristic.

However, the quantum dot has a flat shape, and a compressive strain resulting from a lattice mismatch is inherent therein. Consequently, the gain of the quantum dot SOA exhibits large polarization dependence. That is, regarding the quantum dot SOA, the gain with respect to the light in a transverse electric (TE) mode is larger than the gain with respect to the light in a transverse magnetic (TM) mode. Therefore, if the quantum dot SOA is used, the light in the TE mode is amplified to a great extent as compared with the light in the TM mode.

There are various technologies to improve the polarization dependence.

For example, there is a technology to improve the polarization dependence by quantum-mechanically coupling a plurality of quantum dots through repetition of operations in which InAs quantum dots are formed on a barrier layer disposed on a GaAs substrate and the InAs quantum dots are buried with the barrier layer so as to form a quantum dot layer. In this regard, as for the barrier layer, GaAs, AlGaAs, InGaAs, InGaAsP, InAlGaAs, InAlGaP, and the like are used. Hereafter this technology is referred to as a first technology.

For example, there is a technology to improve the polarization dependence by forming an InAs quantum dot on a barrier layer disposed above an InP substrate and forming a side barrier layer having an elongation strain in such a way as to come into contact with the side surface of the InAs quantum dot. In this regard, as for the barrier layer and the side barrier layer, group III-V compound semiconductor materials, e.g., InGaAsP, InGaAs, InAlGaAs, InAlGaP, and GaIn-NAs, containing In and Ga are used. Hereafter this technology is referred to as a second technology.

For example, there is a technology to realize a polarization-insensitive gain in a 1.55 μm band by using an InGaAsP layer with an elongation strain as a side barrier layer in a SOA which is disposed above an InP substrate and which includes a columnar quantum dot. Hereafter this technology is referred to as a third technology.

In the above-described first technology, it is necessary that the number of lamination of quantum dot layers is increased in order to satisfactorily increase the gain with respect to the light in the TM mode and realize the polarization-insensitive gain. However, it is not easy to increase the number of lamination of quantum dot layers. Consequently, it is not easy to obtain the polarization-insensitive gain.

Furthermore, the above-described second technology and the above-described third technology are technologies in the case where the InAs quantum dot is formed on the barrier layer disposed on the InP substrate and are not technologies in the case where the InAs-containing quantum dot on the GaAs-containing barrier layer is disposed on the GaAs substrate. Consequently, even when the above-described second technology and the above-described third technology are applied to the case where the InAs-containing quantum dot is formed on the GaAs-containing barrier layer, it is difficult to obtain a polarization-insensitive gain.

As for the related art, there are literatures as described below.

Japanese Unexamined Patent Application Publication No. 2004-111710, Japanese Unexamined Patent Application Publication No. 2006-245373, N. Yasuoka et al., "1.55-μm Polarization-Insensitive Quantum Dot Semiconductor Optical Amplifier," ECOC 2008, 21-25 Sep. 2008, Brussels, Belgium, Th.1.C.1, Vol. 4-17, 18.

SUMMARY

According to an aspect of the invention, an optical semiconductor device includes a substrate; and an active layer disposed on the substrate, wherein the active layer includes a first barrier layer containing GaAs, a quantum dot layer, which is disposed on the first barrier layer, which includes a quantum dot containing InAs, which includes a side barrier layer which covers at least a part of the quantum dot and the side surface of the quantum dot, and having an elongation strain inherent therein, and a second barrier layer disposed on the quantum dot layer.

According to another aspect of the invention, a method of manufacturing an optical semiconductor device includes forming a first barrier layer containing GaAs on a substrate; forming a quantum dot having a compressive strain inherent therein on the first barrier layer; forming a side barrier layer, which has a band gap larger than the band gap of the quantum dot, which has an elongation strain inherent therein, and which contains B, in such a way as to cover at least a part of the side surface of the quantum dot; and forming a second barrier layer on the quantum dot and the side barrier layer.

The object and advantages of the invention will be realized and attained by the elements, features, and combinations particularly pointed out in the claims.

It is to be understood that both the foregoing general description and the following detailed description are exemplary and explanatory and are not restrictive of the invention, as claimed.

DESCRIPTION OF EMBODIMENTS

An optical semiconductor device according to a first embodiment and a method of manufacturing the optical semiconductor device will be described with reference to FIG. 1 to FIG. 4.

The optical semiconductor device according to the present embodiment is an optical amplifying device used for optical amplification, among optical semiconductor devices serving as optical fiber communication light sources in, for example, an optical communication system by using an optical fiber.

Figure 1:
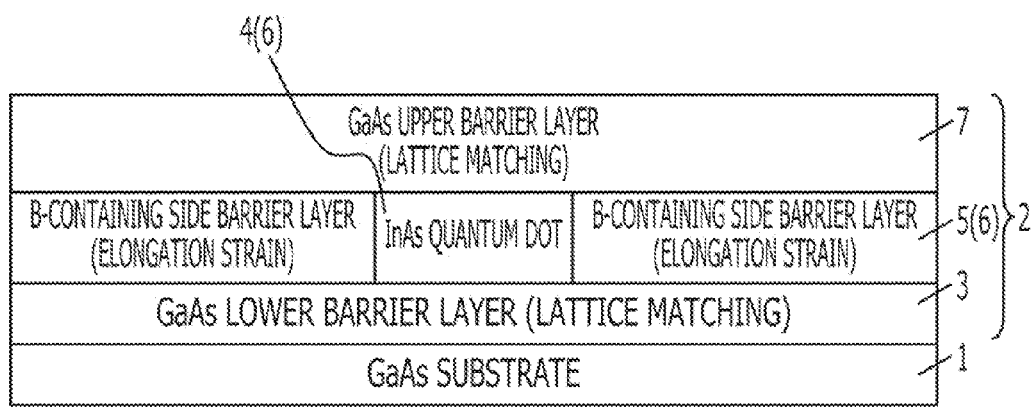
FIG. 1 is a schematic sectional view illustrating the configuration of an optical semiconductor device according to a first embodiment.

Here, as illustrated in FIG. 1, a semiconductor optical amplifier is concerned, which is disposed on a GaAs substrate 1 and which is provided with an element structure having an active layer 2 including a quantum dot 4. Hereafter this semiconductor optical amplifier is referred to as a quantum dot SOA. The above-described quantum dot SOA has excellent characteristics, such as a high temperature characteristic and a high saturation optical output characteristic.

Here, the GaAs substrate 1 is a substrate containing GaAs.

In the present embodiment, the active layer 2 disposed on the GaAs substrate 1 includes a GaAs lower barrier layer 3, a quantum dot layer 6 including the InAs quantum dot 4 and a side barrier layer 5 covering the side surface of the InAs quantum dot 4, and a GaAs upper barrier layer 7. This active layer 2 may be referred to as a quantum dot active layer because the InAs quantum dot 4 is included.

Here, the GaAs lower barrier layer 3 is a lower barrier layer (first barrier layer) containing GaAs. The lower barrier layer 3 is not limited to this insofar as the lower barrier layer lattice-matches GaAs. For example, a GaAsInAs lower barrier layer may be employed.

The InAs quantum dot 4 is disposed on the GaAs lower barrier layer 3. Here, the InAs quantum dot 4 contains InAs having a lattice constant larger than the lattice constant of GaAs serving as the material for the lower barrier layer 3.

The quantum dot 4 is not limited to the InAs quantum dot insofar as the quantum dot contains a semiconductor material suitable for formation on the GaAs substrate 1, that is, the lower barrier layer 3 containing GaAs. For example, the quantum dot 4 may be a quantum dot containing a semiconductor material containing InAs, e.g., InGaAs or GaInNAs.

In the present embodiment, the side barrier layer 5 is disposed on the GaAs lower barrier layer 3 in such a way as to cover the side surface of the InAs quantum dot 4.

Figure 2:
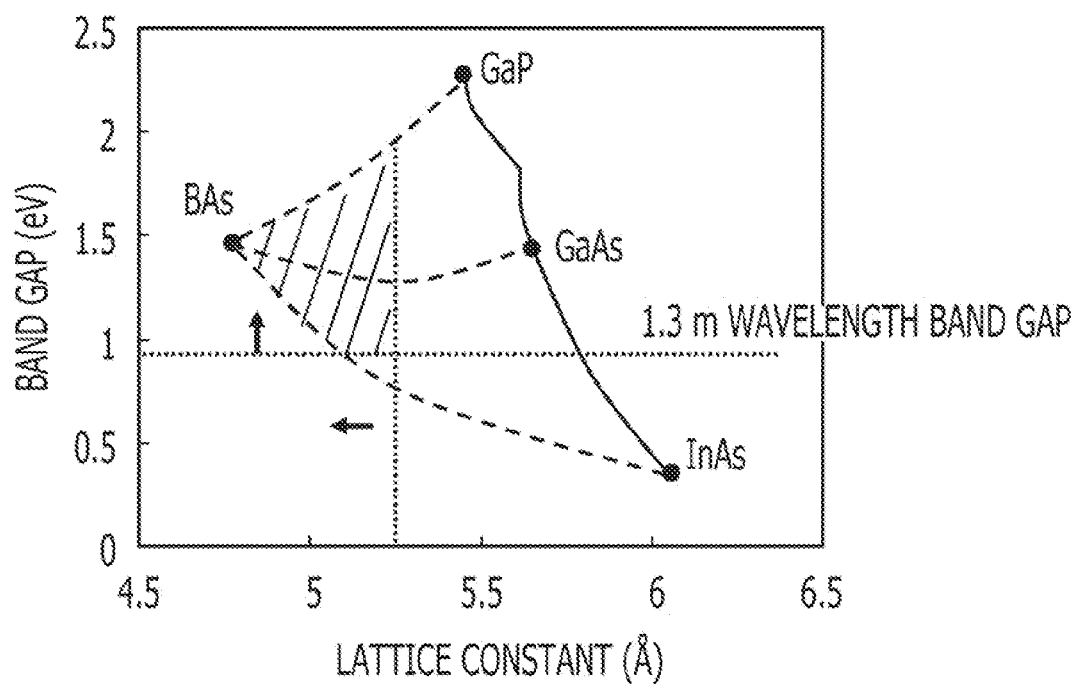
FIG. 2 is a diagram for explaining a material used for a side barrier layer provided in the optical semiconductor device according to the first embodiment.

As illustrated in FIG. 2, the side barrier layer 5 is a semiconductor material having an elongation strain inherent therein and containing boron (B). That is, the side barrier layer 5 contains the semiconductor material containing B, and the lattice constant is smaller than the lattice constant of GaAs.

Here, the side barrier layer 5 contains a semiconductor material containing B and further containing a group V element. That is, the side barrier layer 5 contains a group III-V compound semiconductor material, where B is contained as the group III element.

Specifically, the side barrier layer 5 contains one material selected from the group consisting of BAs, BGaAs, BInAs, BGaInAs, BGaP, BGaAsP, BAsSb, BGaAsSb, BInAsSb, BGaInAsSb, BGaPSb, and BGaAsPSb. In this regard, the side barrier layer 5 may have the material system containing P as the group V element, such as, BGaP and BGaAsP. However, P has a low vapor pressure and may be missed during flashing easily and, therefore, it may be necessary to take care on growing. Furthermore, the material system containing Sb may be employed, although complications may increase, for example, growth may become difficult because of an increase in material system.

In this case, the side barrier layer 5 undergoes an elongation strain from the GaAs lower barrier layer 3. That is, the side barrier layer 5 has an elongation strain inherent therein, the elongation strain corresponding to the difference between the lattice constant of the material for the side barrier layer 5, which is the semiconductor material containing B here, and the lattice constant of GaAs serving as the material for the lower barrier layer 3.

On the other hand, the InAs quantum dot 4 undergoes a compressive strain from the GaAs lower barrier layer 3. That is, the InAs quantum dot 4 has a compressive strain inherent therein, the compressive strain corresponding to the difference between the lattice constant of the material for the quantum dot 4, which is InAs here, and the lattice constant of GaAs serving as the material for the lower barrier layer 3.

Therefore, in the case where a B-containing semiconductor material having a lattice constant smaller than that of GaAs is used as the material for the side barrier layer 5 included in the quantum dot layer 6, the elongation strain inherent in the side barrier layer 5 is allowed to act on the quantum dot 4 having a compressive strain inherent therein. As a result, the compressive strain inherent in the quantum dot 4 can be mitigated and the gain with respect to the light in the TM mode can increase. Hereafter the gain with respect to the light in the TM mode is referred to as a TM gain.

Consequently, in the case where the quantum dot SOA is disposed on the GaAs substrate 1, the TM gain can be controlled easily. That is, in the case where the quantum dot SOA provided with the InAs quantum dot 4 is disposed on the GaAs lower barrier layer 3, the TM gain can be controlled more simply. As a result, the polarization dependence can be improved. In addition, the crystallinity can also be improved.

In particular, in the present embodiment, the side barrier layer 5 contains the B-containing semiconductor material having a lattice constant of about 5.25 Å or less, as illustrated in FIG. 2.

For example, in the case where the side barrier layer 5 is the B-containing semiconductor material having a lattice constant of about 5.25 Å or less, the side barrier layer 5 disposed on the GaAs lower barrier layer 3 undergoes an elongation strain of about 7% because the lattice constant of GaAs, which is the material for the lower barrier layer 3, is about 5.65 Å.

On the other hand, the InAs quantum dot 4 disposed on the GaAs lower barrier layer 3 undergoes a compressive strain of about 7% because the lattice constant of InAs, which is the material for the quantum dot 4, is about 6.06 Å.

Therefore, in the case where a B-containing semiconductor material having a lattice constant of about 5.25 Å is used as the material for the side barrier layer 5, the compressive strain inherent in the quantum dot 4 can be canceled with the elongation strain inherent in the side barrier layer 5. That is, the compressive strain applied from the GaAs lower barrier layer 3 to the InAs quantum dot 4 can be canceled with the elongation strain applied from the GaAs lower barrier layer 3 to the side barrier layer 5. In this case, the InAs quantum dot 4 has no strain. As a result, the TM gain of the InAs quantum dot 4 disposed above the GaAs substrate 1, that is, the InAs quantum dot 4 disposed on the GaAs lower barrier layer 3, and the gain with respect to the light in the TE mode can be made nearly equal. That is, the gain obtained by the InAs quantum dot 4 can be made polarization-insensitive. In this case, good crystallinity is also obtained. Hereafter the gain with respect to the light in the TE mode is referred to as a TE gain. The gain obtained by the InAs quantum dot 4 may be referred to as a material gain.

For example, in the case where the side barrier layer 5 is the B-containing semiconductor material having a lattice constant of less than about 5.25 Å, the side barrier layer 5 disposed on the GaAs lower barrier layer 3 undergoes an elongation strain larger than about 7%. Consequently, the elongation strain can be applied to the quantum dot 4 with the elongation strain inherent in the side barrier layer 5 by using a B-containing semiconductor material having a lattice constant of less than about 5.25 Å as the material for the side barrier layer 5. That is, the elongation strain applied to the side barrier layer 5 by the GaAs lower barrier layer 3 acts on the InAs quantum dot 4, so that the InAs quantum dot 4 has an elongation strain inherent therein. In this case, the band gap between the conduction band and the valence band (light hole) becomes smaller than the band gap between the conduction band and the valence band (heavy hole). As a result, transition between electron and light hole becomes predominant, and the TM gain can be made larger than the TE gain. Then, the optical gain of the SOA can be made polarization-insensitive by adjusting the polarization dependence of the optical confinement factor of a waveguide. Consequently, it is possible to make the quantum dot SOA disposed on the GaAs substrate 1, that is, the quantum dot SOA provided with the InAs quantum dot 4 on the GaAs lower barrier layer 3, polarization-insensitive and, thereby, realize a polarization-insensitive quantum dot SOA. The polarization-insensitive quantum dot SOA may be referred to as a polarization-insensitive optical amplifying device. For example, the polarization dependence of the optical confinement factor of a waveguide can be adjusted by adjusting the thickness of the barrier layer in contact with a clad layer.

As described above, the polarization-insensitive gain is obtained by specifying the absolute value of the difference in lattice constant between the lower barrier layer 3 and the side barrier layer 5 to be larger than or equal to the absolute value of the difference in lattice constant between the lower barrier layer 3 and the quantum dot 4. In this case, the absolute value of the amount of elongation strain inherent in the side barrier layer 5 disposed on the GaAs lower barrier layer 3 becomes larger than or equal to the absolute value of the amount of compressive strain inherent in the quantum dot 4 disposed on the GaAs lower barrier layer 3. Consequently, the InAs quantum dot 4 has no strain or has an elongation strain inherent therein.

Here, the lattice constant or the amount of elongation strain of the side barrier layer 5 is determined on the basis of the lattice constant or the amount of compressive strain of the InAs quantum dot 4, although not limited to this. That is, the lattice constant or the amount of elongation strain of the side barrier layer 5 may be determined on the basis of the lattice constant or the amount of strain of the quantum dot containing InAs. Consequently, a polarization-insensitive gain can be realized.

Additionally, the side barrier layer 5 has a band gap larger than the band gap of the InAs quantum dot 4.

For example, in the case of a 1.3 μm band quantum dot SOA, where the emission wavelength of the InAs quantum dot 4 is about 1.3 μm, the side barrier layer 5 is specified to have a band gap larger than a 1.3 μm wavelength band gap, as illustrated in FIG. 2. Here, the 1.3 μm wavelength band gap is 0.95 eV.

The GaAs upper barrier layer 7 is an upper barrier layer (second barrier layer) containing GaAs, as illustrated in FIG. 1. The upper barrier layer 7 is not limited to this insofar as the upper barrier layer 7 lattice-matches GaAs. For example, a GaAsInAs upper barrier layer may be employed.

Here, as illustrated in FIG. 1, the GaAs upper barrier layer 7 is disposed in such a way as to cover the upper surface of the InAs quantum dot 4 and the upper surface of the side barrier layer 5, that is, the upper surface of the quantum dot layer 6. Put another way, the GaAs upper barrier layer 7 is disposed on the InAs quantum dot 4 and the side barrier layer 5, that is, on the quantum dot layer 6. As described above, the active layer 2 has a structure in which the InAs quantum dot 4 and the side barrier layer 5, that is, the quantum dot layer 6, are sandwiched between the GaAs lower barrier layer 3 and the GaAs upper barrier layer 7.

Specific configuration examples of the quantum dot SOA will be described below with reference to FIG. 3.

Figure 3:
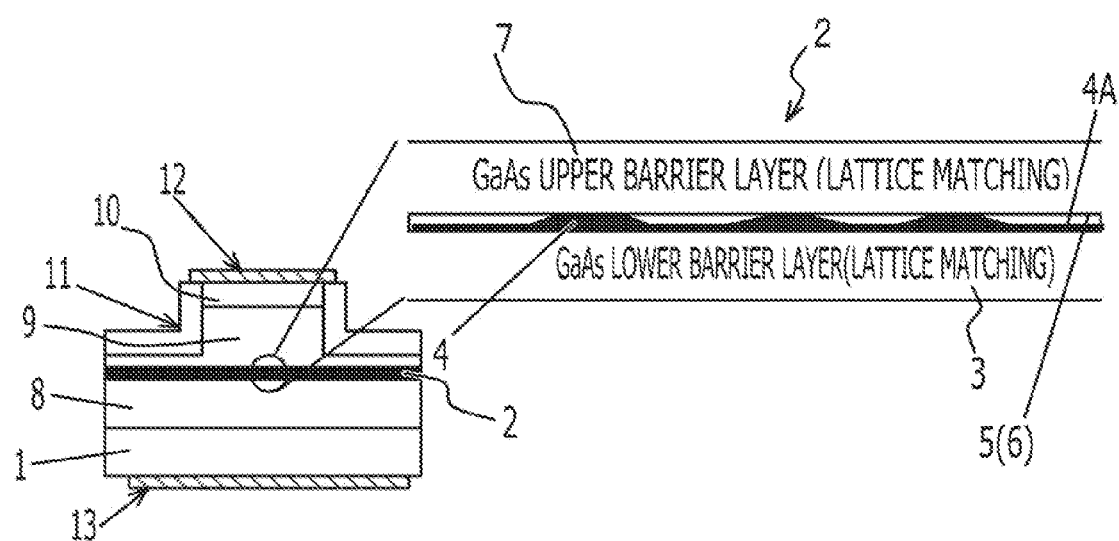
FIG. 3 is a schematic sectional view illustrating the configuration of an optical semiconductor device according to a specific configuration example of the first embodiment.

As illustrated in FIG. 3, the quantum dot SOA has a semiconductor lamination structure in which an n-type AlGaAs lower clad layer 8, an active layer 2, a p-type AlGaAs upper clad layer 9, and a p-type GaAs contact layer 10 are laminated on an n-type GaAs substrate 1. In this regard, the n-type GaAs substrate is an n-type electrically conductive substrate.

Furthermore, a ridge structure formed by etching the p-type AlGaAs upper clad layer 9 partway is included. The ridge structure may be referred to as a ridge waveguide structure. Although not illustrated in the drawing here, the ridge structure is, for example, a slanting ridge structure inclined at about 7° relative to the end surface.

Moreover, the surface of the p-type AlGaAs upper clad layer 9 exposed at the side surface of the ridge structure and both sides of the ridge structure is covered with a $SiO_2$ film 11. The $SiO_2$ film is a passivation film.

An upper electrode 12 is disposed on the p-type GaAs contact layer 10, and a lower electrode 13 is disposed on the back side of the n-type GaAs substrate 1. Here, the upper electrode 12 is a p-side electrode and the lower electrode 13 is an n-side electrode. Although not illustrated in the drawing, nonreflective films may be disposed on both end surfaces of the element.

The active layer 2 is provided with a GaAs lower barrier layer 3, a quantum dot layer 6 including an InAs quantum dot 4 with a wetting layer 4A and a $B_xGa_{1-x}As$ (where $0.46 \leq x \leq 1$) side barrier layer 5, and a GaAs upper barrier layer 7.

The GaAs lower barrier layer 3 is disposed on the n-type AlGaAs lower clad layer 8.

The InAs quantum dot 4 is formed on the GaAs lower barrier layer 3 through self organization. Consequently, the InAs quantum dot 4 is a self-organized quantum dot. That is, the InAs quantum dot 4 is a Stranski-Kastanow (S-K) mode quantum dot formed through S-K mode growth.

The $B_xGa_{1-x}As$ (where $0.46 \leq x \leq 1$) side barrier layer 5 has a lattice constant of about 5.25 Å or less and an elongation strain inherent therein. This $B_xGa_{1-x}As$ (where $0.46 \leq x \leq 1$) side barrier layer 5 has a thickness on the scale of the height of the InAs quantum dot 4 and covers all over the side surface of the InAs quantum dot 4.

The GaAs upper barrier layer 7 is disposed on the InAs quantum dot 4 and the $B_xGa_{1-x}As$ (where $0.46 \leq x \leq 1$) side barrier layer 5.

In the present embodiment, the p-type AlGaAs upper clad layer 9 is disposed on the GaAs upper barrier layer 7.

By the way, in order to make the gain of the InAs quantum dot 4 polarization-insensitive, an elongation strain may be applied from the $B_xGa_{1-x}As$ (where $0.46 \leq x \leq 1$) side barrier layer 5 to the InAs quantum dot 4 in such a way that the compressive strain applied from the GaAs lower barrier layer 3 to the quantum dot 4 is canceled.

The lattice constant of InAs is about 6.06 Å, the lattice constant of GaAs is about 5.65 Å and, therefore, the InAs quantum dot 4 disposed on the GaAs substrate 1, that is, the GaAs lower barrier layer 3, has a compressive strain of about 7% inherent therein. Consequently, transition between electron and heavy hole becomes predominant, and the TE gain increases.

In order to increase the TM gain of the InAs quantum dot 4, the lattice constant of the side barrier layer 5 may be made smaller than the lattice constant of GaAs. Therefore, the side barrier layer 5 disposed on the n-type GaAs substrate 1, that is, the GaAs lower barrier layer 3, may be specified to have an elongation strain inherent therein.

In particular, in order that the TM gain and the TE gain of the InAs quantum dot 4 become nearly equal, the side barrier layer 5 may have an inherent elongation strain having nearly the same absolute value of the amount of strain as the absolute value of the amount of compressive strain inherent in the InAs quantum dot 4. That is, the absolute value of the amount of elongation strain inherent in the side barrier layer 5 may be made about 7% in such a way that the absolute value of the amount of compressive strain inherent in the InAs quantum dot 4 of about 7% is canceled.

Specifically, the $B_xGa_{1-x}As$ (where $0.46 \leq x \leq 1$) side barrier layer 5 may be specified to be $B_{0.46}Ga_{0.54}As$ side barrier layer having a lattice constant of 5.25 Å. Then, the thickness may be specified to be nearly equal to the height of the InAs quantum dot 4, and all over the side surface of the InAs quantum dot 4 may be covered. In this case, the absolute value of the amount of elongation strain inherent in the $B_{0.46}Ga_{0.54}As$ side barrier layer 5 becomes about 7% which is nearly the same as the absolute value of the amount of strain inherent in the InAs quantum dot 4. As a result, the TM gain and the TE gain of the InAs quantum dot 4 can be made nearly equal and the polarization-insensitive gain can be obtained.

In this regard, for example, an actual element structure exhibits polarization dependence of the optical confinement factor. Usually, the optical confinement factor in the TE mode is high and, therefore, the TE gain is larger than the TM gain. Consequently, it is preferable that the TM gain is made larger than the TE gain in order that the element obtains a polarization-insensitive gain.

In this case, for example, the $B_xGa_{1-x}As$ (where $0.46 \leq x \leq 1$) side barrier layer 5 may be specified to be $B_{0.6}Ga_{0.4}As$ side barrier layer having a lattice constant of 5.12 Å. Then, the thickness may be specified to be nearly equal to the height of the InAs quantum dot 4, and all over the side surface of the InAs quantum dot 4 may be covered. In this case, the absolute value of the amount of elongation strain inherent in the $B_{0.6}Ga_{0.4}As$ side barrier layer 5 becomes about 9.3%. This value is about 30% larger than the absolute value of the amount of compressive strain of about 7% inherent in the InAs quantum dot 4. Such an amount of strain is employed in consideration of the strain distribution in the inside of the InAs quantum dot 4, the shape of the InAs quantum dot 4 being not exactly a circular column, a TE/TM ratio of the optical confinement factor of a waveguide, and the like.

In this manner, the TM gain of the InAs quantum dot 4 can be made larger than the TE gain. Consequently, the gain of the quantum dot SOA can be made polarization-insensitive.

In the present specific configuration example, the $B_{0.46}Ga_{0.54}As$ side barrier layer 5 and the $B_{0.6}Ga_{0.4}As$ side barrier layer 5 are used, although not limited to them. For example, $B_xGa_{1-x}As$ (where $0.46 \leq x \leq 1$) side barrier layer 5 may be used and the composition ratio of B to Ga may be adjusted appropriately. The absolute value of the amount of elongation strain inherent in the side barrier layer 5 can be made larger than or equal to the absolute value of the amount of compressive strain inherent in the InAs quantum dot 4 insofar as the $B_xGa_{1-x}As$ (where $0.46 \leq x \leq 1$) side barrier layer 5 is used. That is, the absolute value of the difference in lattice constant between the GaAs lower barrier layer 3 and the side barrier layer 5 can be made larger than or equal to the absolute value of the difference in lattice constant between the GaAs lower barrier layer 3 and the quantum dot 4. Consequently, the TM gain of the InAs quantum dot 4 can be increased to the level larger than or equal to the TE gain. Furthermore, for example, the side barrier layer 5 may be a semiconductor material containing B and a material having a composition with the lattice constant smaller than the lattice constant of GaAs.

The material for the side barrier layer 5 may have a composition with a band gap larger than the band gap of the InAs quantum dot 4. For example, in the case where the emission wavelength of the InAs quantum dot 4 is 1.3 μm, the material for the side barrier layer 5 is specified to have a composition with a band gap larger than a 1.3 μm wavelength band gap (refer to FIG. 2).

Next, a method of manufacturing the optical semiconductor device according to the present embodiment will be described.

A GaAs-containing lower barrier layer (first barrier layer) 3 is formed on a GaAs-containing substrate 1 (refer to FIG. 1).

A quantum dot 4 having a compressive strain inherent therein, that is, an InAs-containing quantum dot 4 is formed on a GaAs-containing lower barrier layer 3 (refer to FIG. 1).

A B-containing side barrier layer 5 having a band gap larger than the band gap of the InAs-containing quantum dot 4 and having an elongation strain inherent therein is formed in such a way as to cover the side surface of the InAs-containing quantum dot 4 (refer to FIG. 1). In this manner, the quantum dot layer 6 including the InAs-containing quantum dot 4 and the B-containing side barrier layer 5 is formed. In this regard, the upper portion of the InAs-containing quantum dot 4 may be flattened after the side barrier layer 5 is formed.

A GaAs-containing upper barrier layer (second barrier layer) 7 is formed on the quantum dot 4 and the side barrier layer 5 (refer to FIG. 1).

A method of manufacturing a quantum dot SOA according to the specific configuration example of the present embodiment will be more specifically described below with reference to FIG. 4.

For example, a molecular beam epitaxy (MBE) method is used for growing each semiconductor layer.

Figure 4A:
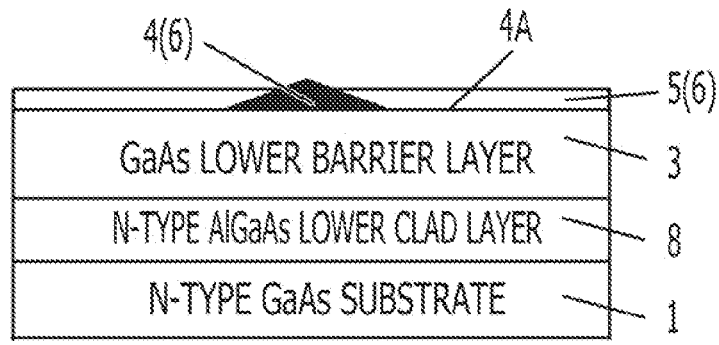
FIGS. 4A to 4C are schematic sectional views for explaining a method of manufacturing the optical semiconductor device according to the first embodiment.

As illustrated in FIG. 4A, an n-AlGaAs lower clad layer 8 is formed on an n-GaAs substrate 1.

The n-GaAs substrate 1 is an n-GaAs (001) substrate. The thickness of the n-AlGaAs lower clad layer 8 is, for example, about 1.4 µm.

As illustrated in FIG. 4A, the GaAs lower barrier layer 3 is formed on the n-AlGaAs lower clad layer 8. Here, the thickness of the GaAs lower barrier layer 3 is, for example, about 160 nm.

The InAs quantum dot 4 having a surface density of, for example, about $4 \times 10^{10}$ cm$^{-2}$ is formed on the GaAs lower barrier layer 3 by a self organization method. In the present embodiment, a very thin InAs layer referred to as a wetting layer 4A is formed on the surface to be provided with the InAs quantum dot 4 through self organization.

A $B_xGa_{1-x}As$ (where $0.46 \leq x \leq 1$) side barrier layer 5 is formed in such a way as to cover the side surface of the InAs quantum dot 4. For example, the thickness of the $B_xGa_{1-x}As$ (where $0.46 \leq x \leq 1$) side barrier layer 5 is specified to be smaller than the height of the InAs quantum dot 4. In this manner, a quantum dot layer 6 including the InAs quantum dot 4 and the $B_xGa_{1-x}As$ (where $0.46 \leq x \leq 1$) side barrier layer 5 is formed.

Figure 4B:
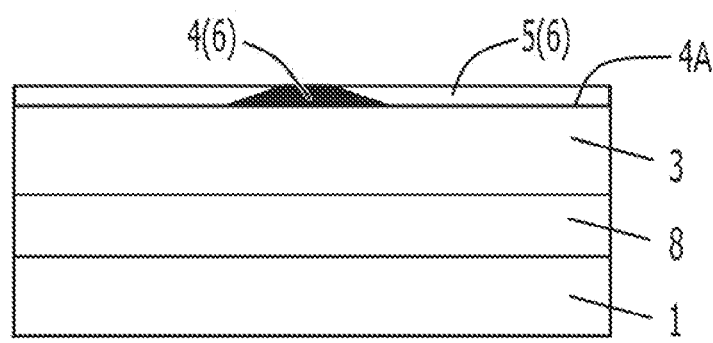

As illustrated in FIG. 4B, the temperature of the inside of an MBE growing furnace is raised, and the top portion of the InAs quantum dot 4 is revaporized by, for example, a flashing method. Consequently, the upper portion of the InAs quantum dot 4 is substantially flattened, and the height of the InAs quantum dot 4 is made nearly equal to the thickness of the $B_xGa_{1-x}As$ (where $0.46 \leq x \leq 1$) side barrier layer 5. As a result, the quantum dot layer 6 is formed, in which the side surface of the InAs quantum dot 4 is covered with the $B_xGa_{1-x}As$ (where $0.46 \leq x \leq 1$) side barrier layer 5 and the surface is flattened.

Figure 4C:
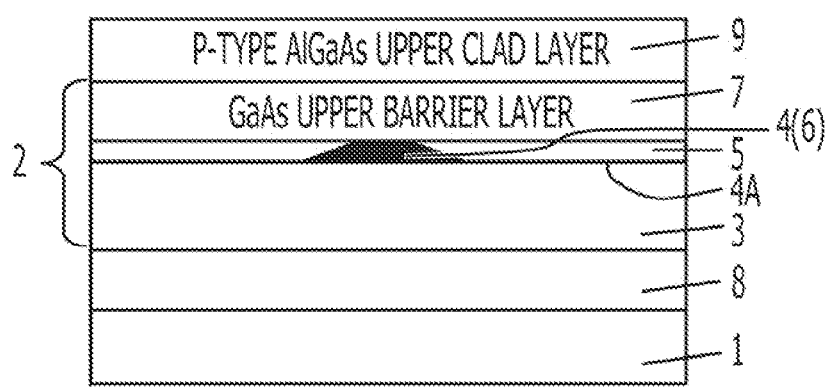

As illustrated in FIG. 4C, a GaAs upper barrier layer 7 is formed on the quantum dot layer 6, that is, the InAs quantum dot 4 and the $B_xGa_{1-x}As$ (where $0.46 \leq x \leq 1$) side barrier layer 5, in such a way as to cover them. Here, the thickness of the GaAs upper barrier layer 7 is, for example, about 160 nm.

In this manner, a quantum dot active layer 2 provided with the GaAs lower barrier layer 3, the quantum dot layer 6 including the InAs quantum dot 4 and the $B_xGa_{1-x}As$ (where $0.46 \leq x \leq 1$) side barrier layer 5, and the GaAs upper barrier layer 7 is formed on the n-AlGaAs lower clad layer 8.

A p-AlGaAs upper clad layer 9 and a p-GaAs contact layer 10 are formed on the GaAs upper barrier layer 7 (refer to FIG. 3).

The thickness of the p-AlGaAs upper clad layer 9 is, for example, about 1.4 µm. The thickness of the p-GaAs contact layer 10 is, for example, about 0.4 µm.

After the crystal is grown as described above, working into the element structure of the SOA is performed.

Although not illustrated in the drawing, a SiO$_2$ film is formed, and a ridge waveguide pattern inclined at, for example, about 7° relative to the end surface is formed on the SiO$_2$ film by using, for example, photolithography.

The resulting SiO$_2$ film provided with the ridge waveguide pattern is used as a mask, and the pattern is transferred to the p-GaAs contact layer 10 and the p-AlGaAs upper clad layer 9 through, for example, dry etching. For example, a part of the p-GaAs contact layer 10 and the p-AlGaAs upper clad layer 9, which are not covered with the SiO$_2$ mask, are removed through, for example, dry etching, so as to expose the p-AlGaAs upper clad layer 9. In this manner, a slanting ridge waveguide structure is formed, which includes the p-GaAs contact layer 10 and the p-AlGaAs upper clad layer 9, which has a width of, for example, about 2 µm, and which is inclined at, for example, about 7° relative to the end surface (refer to FIG. 3).

Here, the ridge waveguide structure is formed by removing the p-AlGaAs upper clad layer 9 partway, although not limited to this. For example, the p-AlGaAs upper clad layer 9 may be removed just above the active layer 2, that is, the p-AlGaAs upper clad layer 9 may be removed completely, so as to expose the active layer 2, and the ridge waveguide structure may be formed.

The SiO$_2$ mask, although not illustrated in the drawing, is removed, and a SiO$_2$ film 11 is formed in such a way as to cover the side surface of the ridge waveguide structure and the surface of the p-AlGaAs upper clad layer 9 (refer to FIG. 3). The SiO$_2$ mask may be referred to as a SiO$_2$ film for forming a waveguide pattern. Subsequently, electrodes 12 and 13 for current injection are formed on the upper portion and the lower portion. Although not illustrated in the drawing, non-reflective films are formed on both end surfaces of the element.

The optical semiconductor device and the method of manufacturing the optical semiconductor device according to the present embodiment have an advantage that in the case where the InAs-containing quantum dot 4 is formed on the GaAs-containing lower barrier layer 3, a polarization-insensitive gain can be obtained easily.

In the above-described embodiment, the active layer 2 is provided with the single-layer quantum dot layer 6, although not limited to this. A plurality of quantum dot layers may be laminated repeatedly while sandwiching the barrier layer.

Furthermore, in the above-described embodiment, the side barrier layer 5 is specified to have the same thickness as the thickness corresponding to the height of the quantum dot 4, that is, the side surface of the quantum dot 4 is covered, and the compressive strain inherent in the quantum dot 4 is canceled, although not limited to them. For example, the side barrier layer 5 may be specified to have a thickness smaller than the thickness corresponding to the height of the quantum dot 4, that is, at least a part of the side surface of the quantum dot 4 may be covered, and the compressive strain inherent in the quantum dot 4 is canceled. As described above, the thickness of the side barrier layer can be made smaller than or equal to the height of the quantum dot by using the B-containing side barrier layer 5 having an elongation strain inherent therein.

An optical semiconductor device and a method of manufacturing the optical semiconductor device according to a second embodiment will be described with reference to FIG. 5 to FIG. 7.

Figure 5:
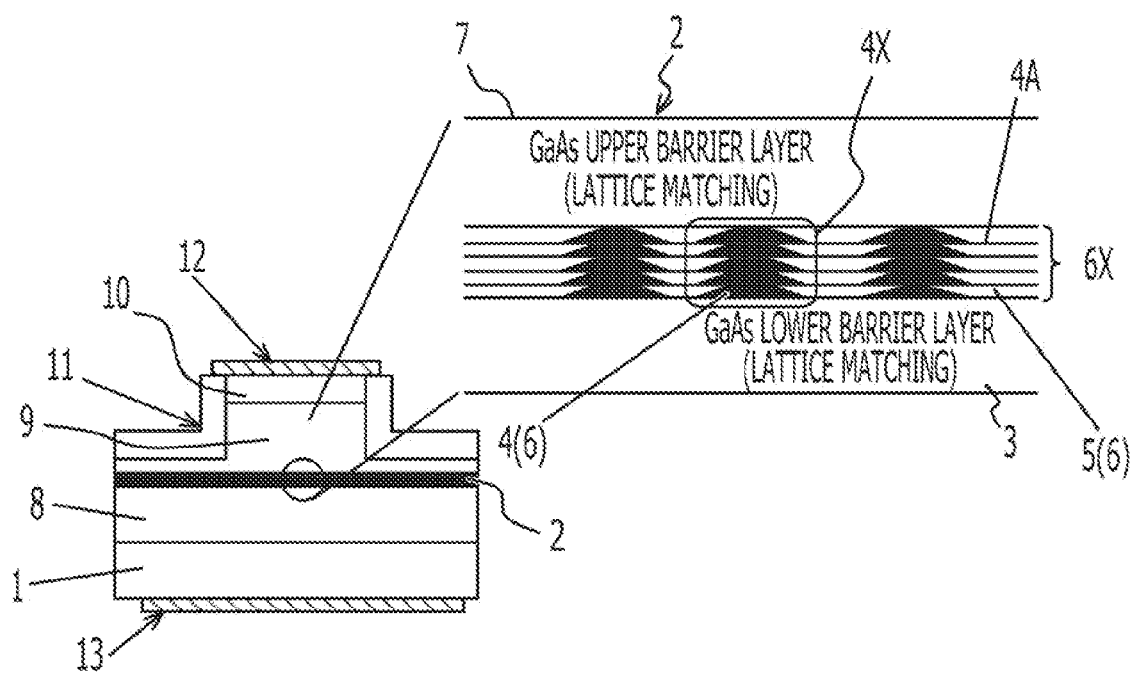
FIG. 5 is a schematic sectional view illustrating the configuration of an optical semiconductor device according to a second embodiment.
Figure 6:
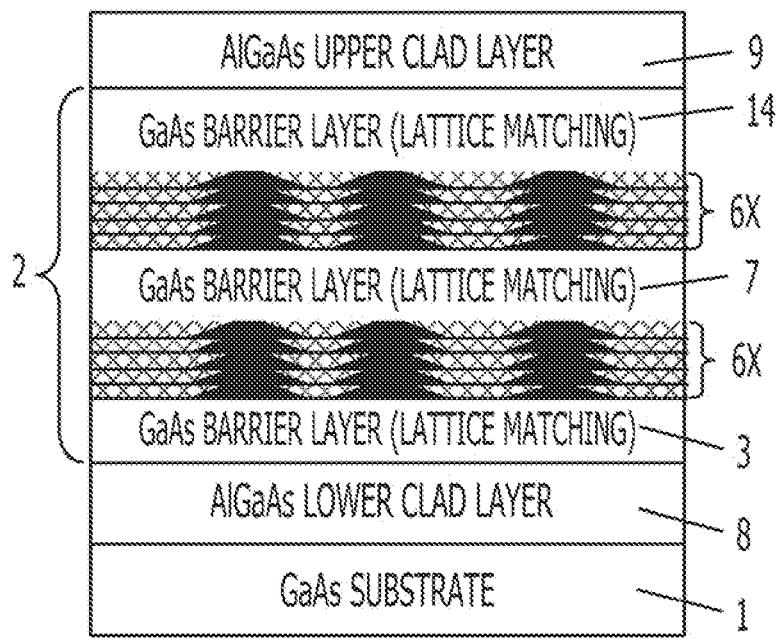
FIG. 6 is a schematic sectional view illustrating the configuration of an optical semiconductor device according to a modified example of the second embodiment.

The optical semiconductor device according to the present embodiment is different from the optical semiconductor device in the specific configuration example of the above-described first embodiment (refer to FIG. 3) in that an active layer 2 includes a coupled quantum dot 4X in which a plurality of quantum dots 4 are closely stacked, as illustrated in FIG. 5. In FIG. 5, the same members as those in the specific configuration example of the above-described first embodiment (refer to FIG. 3) are indicated by the same reference numerals as those set forth above.

In the specific configuration example of the present embodiment, the active layer 2 is provided with a plurality of quantum dot layers 6 between a GaAs lower barrier layer (first barrier layer) 3 and a GaAs upper barrier layer (second barrier layer) 7. Here, five quantum dot layers are disposed as the plurality of quantum dot layers 6.

Each quantum dot layer 6 includes InAs quantum dots 4 with the wetting layer 4A and the $B_xGa_{1-x}As$ (where 0.46≤x≤1) side barrier layer 5. The plurality of quantum dot layers 6 are laminated in such a way that the InAs quantum dots 4 come into contact with each other vertically. Consequently, the InAs quantum dots 4 included in the individual quantum dot layers 6 are stacked vertically and are quantum-mechanically coupled to each other, so that the columnar coupled quantum dot 4X is formed.

The columnar coupled quantum dot 4X may be referred to as a closely stacked coupled quantum dot, a closely stacked columnar dot, a coupled quantum dot, or a columnar dot. Furthermore, the coupled quantum dot 4X is included in the laminate of the plurality of quantum dot layers 6 and, therefore, the whole of the plurality of quantum dot layers 6 is referred to as a coupled quantum dot layer 6X.

In the case where the columnar coupled quantum dot 4X is disposed, as described above, the aspect ratio (height/diameter) can be increased and the TM gain can be increased. Consequently, for example, the gain obtained by the quantum dot 4 is made polarization-insensitive on the basis of the material for the side barrier layer 5, the aspect ratio is increased by formation of the columnar coupled quantum dot 4X, and the TM gain is increased, so that a polarization-insensitive quantum dot SOA can be realized. In this case, the compressive strain inherent in the quantum dot 4 is canceled and, therefore, a polarization-insensitive gain can be realized while good crystallinity is obtained. As described above, the polarization-insensitive quantum dot SOA can also be realized by combining the control of the TM gain on the basis of the material for the side barrier layer 5 and the number of stacking of quantum dots included in the columnar coupled quantum dot 4X, that is, the control of the TM gain on the basis of the aspect ratio.

Moreover, the optical confinement factor is increased by forming the above-described columnar coupled quantum dot 4X and, therefore, the gain to amplify the light can be increased. Consequently, in the case where the TM gain is made larger than the TE gain on the basis of the material for the side barrier layer 5 so as to realize the polarization-insensitive quantum dot SOA in consideration of the polarization dependence of the optical confinement factor of the waveguide as well, the gain can be increased by forming the columnar coupled quantum dot 4X.

In addition, in the case where the $B_xGa_{1-x}As$ (where 0.46≤x≤1) side barrier layer 5 is used, the thickness of the side barrier layer 5 becomes nearly equal to the height of quantum dot 4 and the compressive strain of about 7% applied to the InAs quantum dot 4 can be canceled. Consequently, a high-aspect ratio columnar coupled quantum dot 4X can be formed easily while the crystallinity is not influenced.

In the present embodiment, five InAs quantum dots 4 are stacked and, thereby, the columnar coupled quantum dot 4X having a five-storied structure is formed, although not limited to this. Other numbers of stacking may be employed.

In the present embodiment, the active layer 2 is provided with a single stage of coupled quantum dot layer 6X, although not limited to this. As necessary, a structure in which a plurality of stages of coupled quantum dot layers 6X are laminated may be employed. For example, as illustrated in FIG. 6, the active layer 2 may be provided with two stages of coupled quantum dot layers 6X. In this case, the active layer 2 may be formed by forming a second stage of coupled quantum dot layer 6X and a GaAs upper barrier layer (second barrier layer) 14 on the above-described GaAs upper barrier layer 7. In this regard, the GaAs upper barrier layer 7 is a GaAs lower barrier layer (first barrier layer) relative to the second stage of coupled quantum dot layer 6X. That is, the GaAs barrier layer 7 is the upper barrier layer (second barrier layer) relative to the first stage of coupled quantum dot layer 6X and is the lower barrier layer (first barrier layer) relative to the second stage of coupled quantum dot layer 6X. In FIG. 6, the same members as those in the above-described embodiment (refer to FIG. 5) are indicated by the same reference numerals as those set forth above. As described above, in the case where a plurality of stages of coupled quantum dot layers 6X are disposed, the plurality of stages of coupled quantum dot layers 6X may be laminated with GaAs barrier layers therebetween. The barrier layer is not limited to the GaAs barrier layer insofar as the barrier layer contains GaAs. In this case, the active layer 2 has a structure in which the GaAs lower barrier layer (first barrier layer), the coupled quantum dot layer, and the GaAs upper barrier layer (second barrier layer) are laminated repeatedly.

Other configurations are similar as those in the case of the above-described first embodiment and, therefore, explanations thereof are omitted here.

Next, a method of manufacturing the optical semiconductor device according to the present embodiment will be described.

The method of manufacturing the present optical semiconductor device includes the following operations in the method of manufacturing the optical semiconductor device in the above-described first embodiment.

Before the GaAs upper barrier layer (second barrier layer) 7 is formed, an operation to form the quantum dot 4 and an operation to form the side barrier layer 5 are repeated at least once, so that a coupled quantum dot layer 6X including columnar coupled quantum dots 4X is formed. Here, the operation to form the quantum dot 4 and the operation to form the side barrier layer 5 are repeated five times, so that a coupled quantum dot layer 6X including columnar coupled quantum dots 4X is formed (refer to FIG. 5).

In the case where a plurality of stages of coupled quantum dot layers 6X are laminated (refer to FIG. 6), the following operations are included.

An operation to form the GaAs lower barrier layer (first barrier layer), an operation to form the coupled quantum dot layer 6X including the columnar coupled quantum dots 4X, and an operation to form the GaAs upper barrier layer (second barrier layer) are repeated at least once. Here, the operation to form the GaAs lower barrier layer, the operation to form the coupled quantum dot layer 6X including the columnar coupled quantum dots 4X, and the operation to form the GaAs upper barrier layer are repeated once (refer to FIG. 6).

A method of manufacturing a quantum dot SOA according to the specific configuration example of the present embodiment will be more specifically described below with reference to FIGS. 7A to 7E.

The MBE method is used for growing each semiconductor layer.

Figure 7A:
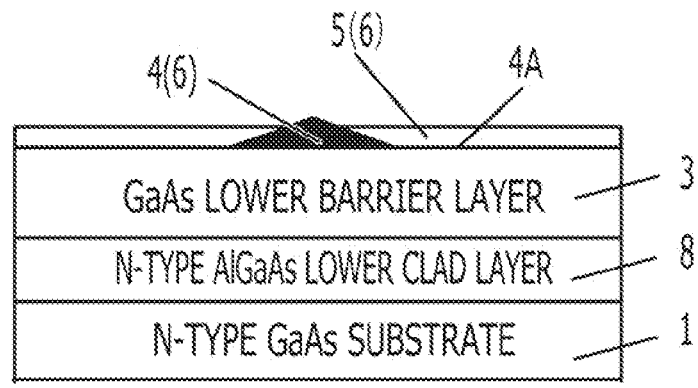
FIGS. 7A to 7E are schematic sectional views for explaining a method of manufacturing the optical semiconductor device according to the second embodiment.

Initially, in a manner similar to that in the above-described specific configuration example of the first embodiment, as illustrated in FIG. 7A, the n-AlGaAs lower clad layer 8 is formed on the n-GaAs substrate 1.

As illustrated in FIG. 7A, the GaAs lower barrier layer 3 is formed on the n-AlGaAs lower clad layer 8.

The InAs quantum dot 4 having a surface density of, for example, about $4 \times 10^{10}$ $cm^{-2}$ is formed on the GaAs lower barrier layer 3 by a self organization method. In the present embodiment, a very thin InAs layer referred to as a wetting layer 4A is formed on the surface to be provided with the InAs quantum dot 4 through self organization.

The $B_xGa_{1-x}As$ (where 0.46≤x≤1) side barrier layer 5 is formed in such a way as to cover the side surface of the InAs quantum dot 4. The thickness of the $B_xGa_{1-x}As$ (where $0.46 \leq x \leq 1$) side barrier layer 5 is specified to be smaller than the height of the InAs quantum dot 4. In this manner, the quantum dot layer 6 including the InAs quantum dot 4 and the $B_xGa_{1-x}As$ (where $0.46 \leq x \leq 1$) side barrier layer 5 is formed.

Figure 7B:
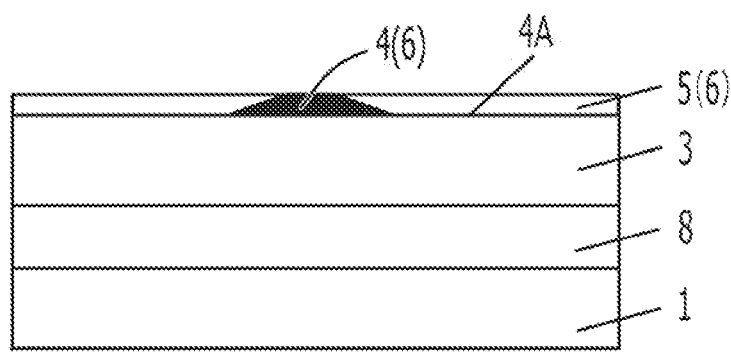

As illustrated in FIG. 7B, the temperature of the inside of the MBE growing furnace is raised, and the top portion of the InAs quantum dot 4 is revaporized by, for example, a flashing method. Consequently, the upper portion of the InAs quantum dot 4 is substantially flattened, and the height of the InAs quantum dot 4 is made nearly equal to the thickness of the $B_xGa_{1-x}As$ (where $0.46 \leq x \leq 1$) side barrier layer 5. As a result, the first layer of the quantum dot layer 6 is formed, in which all over the side surface of the InAs quantum dot 4 is covered with the $B_xGa_{1-x}As$ (where $0.46 \leq x \leq 1$) side barrier layer 5 and the surface is substantially flattened.

Figure 7C:
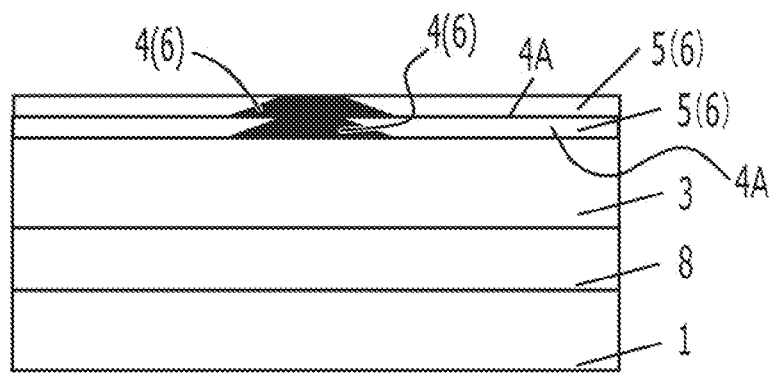

As illustrated in FIG. 7C, in a manner similar to that in the above description, the InAs quantum dot 4 is formed on the first layer of the quantum dot layer 6 formed as described above. In this case, the InAs quantum dot 4 is formed on the InAs quantum dot 4 included in the first layer of the quantum dot layer 6. That is, the upper and lower InAs quantum dots are stacked vertically to come into contact with each other and are quantum-mechanically coupled.

The compressive strain inherent in the InAs quantum dot 4 is canceled with the elongation strain inherent in the $B_xGa_{1-x}As$ (where $0.46 \leq x \leq 1$) side barrier layer 5 and, thereby, the TM gain of the InAs quantum dot 4 becomes larger than or equal to the TE gain. However, strain tends to remain locally in a portion not contributing to the gain of the InAs quantum dot 4, that is, the upper portion of the InAs quantum dot 4. Consequently, a quantum dot 4 grows on the quantum dot 4 included in the first layer of the quantum dot layer 6.

Figure 7D:
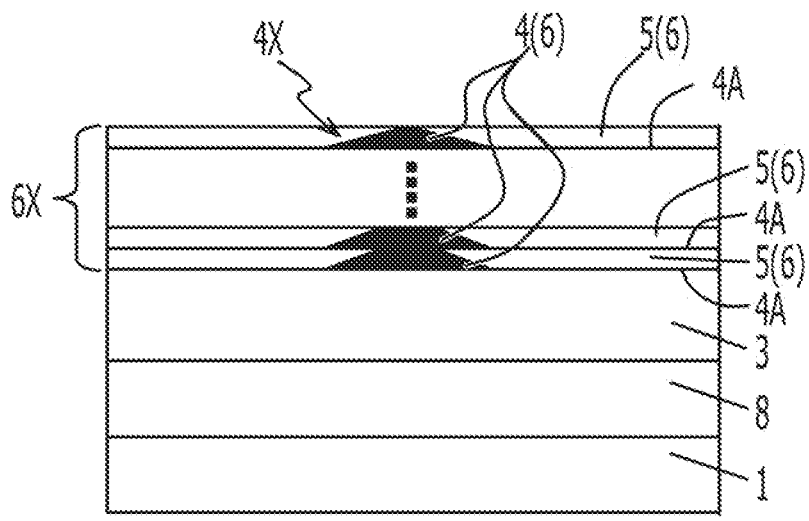

Then, in a manner similar to that in the above description, after the $B_xGa_{1-x}As$ (where $0.46 \leq x \leq 1$) side barrier layer 5 is formed, as illustrated in FIG. 7D, the top portion of the InAs quantum dot 4 is revaporized by, for example, a flashing method, so as to flatten the upper portion of the InAs quantum dot 4. Consequently, the second layer of the quantum dot layer 6 having a flattened surface is formed.

Thereafter, the above-described operation to form the quantum dot layer 6 is performed repeatedly, so as to laminate a plurality of quantum dot layers 6. For example, five quantum dot layers 6 are laminated. Consequently, the plurality of InAs quantum dots 4 are stacked and are quantum-mechanically coupled, so that a columnar coupled quantum dot 4X is formed. Here, the columnar coupled quantum dot 4X is formed, in which five InAs quantum dots 4 are stacked. In this manner, the coupled quantum dot layer 6X including the columnar coupled quantum dots 4X is formed.

Figure 7E:
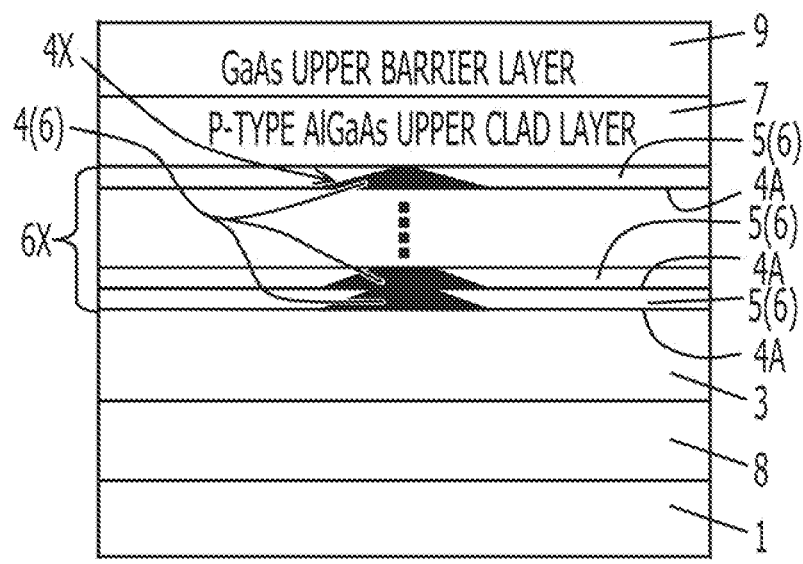

As illustrated in FIG. 7E, a GaAs upper barrier layer 7 is formed on the coupled quantum dot layer 6X including the columnar coupled quantum dots 4X, that is, the InAs quantum dot 4 and the $B_xGa_{1-x}As$ (where $0.46 \leq x \leq 1$) side barrier layer 5 in the uppermost layer, in such a way as to cover them.

In this manner, an active layer 2 provided with the GaAs lower barrier layer 3, the coupled quantum dot layer 6X including the columnar coupled quantum dots 4X, and the GaAs upper barrier layer 7 is formed on the n-AlGaAs lower clad layer 8.

In a manner similar to that in the above-described specific configuration example of the first embodiment, the p-AlGaAs upper clad layer 9 and the p-GaAs contact layer 10 are formed on the GaAs upper barrier layer 7 (refer to FIG. 5).

After the crystal is grown as described above, working into the element structure of the SOA is performed in a manner similar to that in the above-described specific configuration example of the first embodiment.

Although not illustrated in the drawing, a $SiO_2$ film is formed, and a ridge waveguide pattern inclined at, for example, about 7° relative to the end surface is formed on the $SiO_2$ film by using, for example, photolithography.

The resulting $SiO_2$ film provided with the ridge waveguide pattern is used as a mask, and the pattern is transferred to the p-GaAs contact layer 10 and the p-AlGaAs upper clad layer 9 through, for example, dry etching. In this manner, a slanting ridge waveguide structure is formed, which includes the p-GaAs contact layer 10 and the p-AlGaAs upper clad layer 9, which has a width of, for example, about 2 μm, and which is inclined at, for example, about 7° relative to the end surface (refer to FIG. 5).

The $SiO_2$ mask, although not illustrated in the drawing, is removed, and the $SiO_2$ film 11 is formed in such a way as to cover the side surface of the ridge waveguide structure and the surface of the p-AlGaAs upper clad layer 9 (refer to FIG. 5). The $SiO_2$ mask may be referred to as a $SiO_2$ film for forming a waveguide pattern. Subsequently, electrodes 12 and 13 for current injection are formed on the upper portion and the lower portion. Although not illustrated in the drawing, non-reflective films are formed on both end surfaces of the element.

Other details are the same as those in the above-described first embodiment and, therefore, explanations thereof are omitted here.

The optical semiconductor device and the method of manufacturing the optical semiconductor device according to the present embodiment have an advantage that a polarization-insensitive gain can be obtained easily as in the case of the above-described first embodiment.

An optical semiconductor device and a method of manufacturing the optical semiconductor device according to a third embodiment will be described with reference to FIG. 8 and FIG. 9.

In the present embodiment, the case where the present invention is applied to a quantum dot SOA provided with an S-K mode quantum dot will be described as an example.

Figure 8:
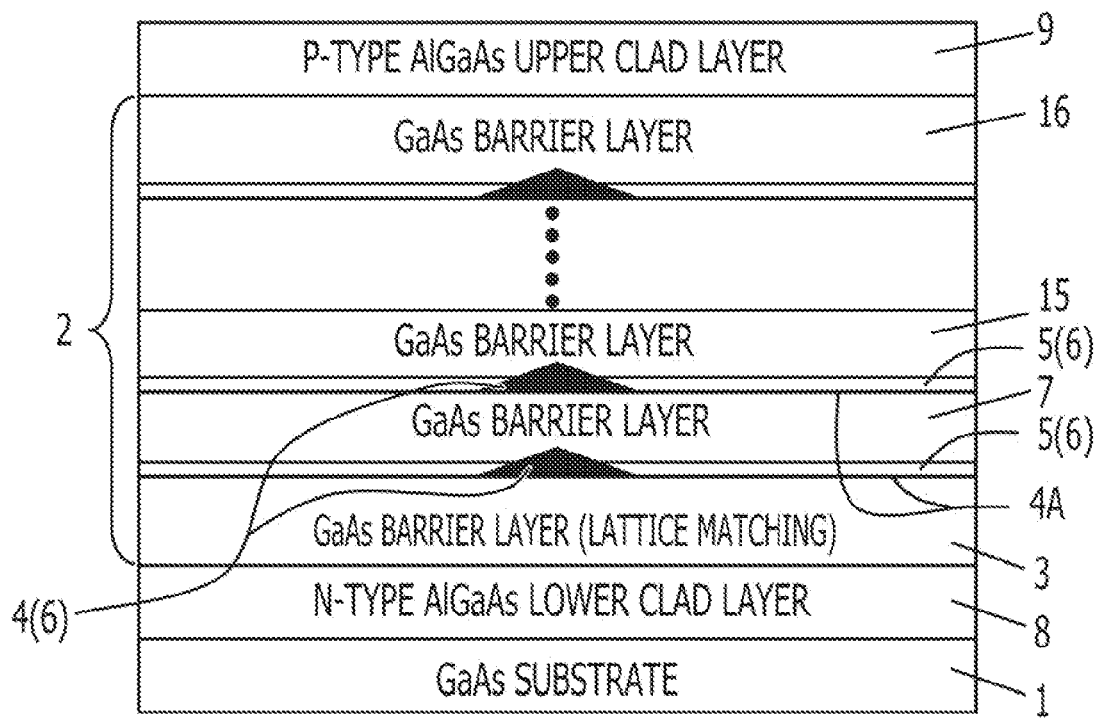
FIG. 8 is a schematic sectional view illustrating the configuration of an optical semiconductor device according to a third embodiment.

The present optical semiconductor device is different from the optical semiconductor device in the above-described first embodiment (refer to FIG. 1 and FIG. 3) in that the quantum dots 4 are stacked with barrier layers 7 and 15 therebetween repeatedly, the side barrier layer 5 covers at least a part of the side surface of the quantum dot 4, and the side barrier layer 5 is a BAs side barrier layer in the specific configuration example, as illustrated in FIG. 8. In FIG. 8, the same members as those in the above-described first embodiment (refer to FIG. 1 and FIG. 3) are indicated by the same reference numerals as those set forth above.

In the present embodiment, the active layer 2 disposed above the GaAs substrate 1 includes the GaAs lower barrier layer 3, the quantum dot layers 6 includes the InAs quantum dot 4 and the side barrier layer 5 covering the side surface of the InAs quantum dot 4, and the GaAs upper barrier layer 7.

Here, the GaAs lower barrier layer 3 is a GaAs-containing lower barrier layer (first barrier layer), as in the case of the above-described first embodiment. A lower barrier layer containing GaAs is sufficient for the lower barrier layer 3.

In a manner similar to that in the above-described first embodiment, the InAs quantum dot 4 is disposed on the GaAs lower barrier layer 3. Here, the InAs quantum dot 4 contains InAs having a lattice constant larger than the lattice constant of GaAs serving as the material for the GaAs lower barrier layer 3. The quantum dot 4 may be a quantum dot containing InAs.

The side barrier layer 5 is disposed on the GaAs lower barrier layer 3 in such a way as to cover a part of the side surface of the InAs quantum dot 4.

Here, the side barrier layer 5 is a semiconductor material having an elongation strain inherent therein and containing B, as in the case of the above-described first embodiment. That is, the side barrier layer 5 is the semiconductor material containing B and the lattice constant is smaller than the lattice constant of GaAs. Here, the side barrier layer 5 is a semiconductor material containing B and further containing a group V element. That is, the side barrier layer 5 is a group III-V compound semiconductor material, where B is contained as the group III element.

In the present embodiment, the side barrier layer 5 contains BAs having a lattice constant of about 5.25 Å or less, and specifically, having a lattice constant of about 4.78 Å.

In this case, the side barrier layer 5 has an elongation strain inherent therein, the elongation strain corresponding to the difference between the lattice constant of the material for the side barrier layer 5, which is BAs here, and the lattice constant of the material for the lower barrier layer 3, which is GaAs here. Specifically, in the case where BAs having a lattice constant of about 4.78 Å is used as the material for the side barrier layer 5, the side barrier layer 5 disposed on the GaAs lower barrier layer 3 undergoes an elongation strain of about 15% because the lattice constant of GaAs serving as the material for the lower barrier layer 3 is about 5.65 Å. That is, the BAs side barrier layer 5 undergoes an elongation strain of about 15% from the GaAs lower barrier layer 3.

On the other hand, the InAs quantum dot 4 has an inherent compressive strain corresponding to the difference between the lattice constant of the material for the quantum dot 4, which is InAs here, and the lattice constant of the material for the lower barrier layer 3, which is GaAs. Specifically, the lattice constant of InAs is about 6.06 Å and the lattice constant of GaAs serving as the material for the lower barrier layer 3 is about 5.65 Å. Therefore, the InAs quantum dot 4 disposed on the GaAs lower barrier layer 3 undergoes a compressive strain of about 7%. That is, the InAs quantum dot 4 undergoes a compressive strain of about 7% from the GaAs lower barrier layer 3.

As described above, in the present embodiment, the amount of elongation strain applied from the GaAs lower barrier layer 3 to the BAs side barrier layer 5 becomes about 15%, and is about 2 times the amount of compressive strain of about 7% applied from the GaAs lower barrier layer 3 to the InAs quantum dot 4. In this case, the compressive strain inherent in the InAs quantum dot 4 can be canceled if the thickness of the side barrier layer 5 is about one-half the height of the InAs quantum dot 4.

Therefore, in the present embodiment, the side barrier layer 5 is formed in such a way as to have a thickness about one-half the height of the InAs quantum dot 4 and cover a part (first portion) of the side surface of the InAs quantum dot 4.

Consequently, the TM gain and the TE gain of the InAs quantum dot 4 disposed on the GaAs substrate 1, that is, the InAs quantum dot 4 disposed on the GaAs lower barrier layer 3, can be made nearly equal. That is, the gain obtained by the InAs quantum dot 4 can be made polarization-insensitive. In this case, good crystallinity is obtained.

Furthermore, in the case where the thickness of the side barrier layer 5 is specified to be larger than the thickness about one-half the height of the InAs quantum dot 4, an elongation strain can be applied to the quantum dot 4 by the elongation strain inherent in the side barrier layer 5. That is, the elongation strain applied to the side barrier layer 5 from the GaAs lower barrier layer 3 acts on the InAs quantum dot 4, so that the InAs quantum dot 4 has an elongation strain inherent therein. In this case, the band gap between the conduction band and the valence band (light hole) becomes smaller than the band gap between the conduction band and the valence band (heavy hole). As a result, transition between electron and light hole becomes predominant, and the TM gain can be made larger than the TE gain. Then, the optical gain of the SOA can be made polarization-insensitive by adjusting the polarization dependence of the optical confinement factor of a waveguide. Consequently, it is possible to make the quantum dot SOA disposed on the GaAs substrate 1, that is, the quantum dot SOA provided with the InAs quantum dot 4 on the GaAs lower barrier layer 3, polarization-insensitive and, thereby, realize a polarization-insensitive quantum dot SOA. The polarization-insensitive quantum dot SOA may be referred to as a polarization-insensitive optical amplifying device. For example, the polarization dependence of the optical confinement factor of a waveguide can be adjusted by adjusting the thickness of the barrier layer in contact with a clad layer.

As described above, the thickness of the side barrier layer can be made smaller than or equal to the height of the quantum dot by using the B-containing side barrier layer 5 having an elongation strain inherent therein.

Furthermore, the polarization-insensitive gain is obtained by specifying the absolute value of the difference in lattice constant between the lower barrier layer 3 and the side barrier layer 5 to be larger than or equal to the absolute value of the difference in lattice constant between the lower barrier layer 3 and the quantum dot 4. In this case, the absolute value of the amount of elongation strain inherent in the side barrier layer 5 disposed on the GaAs lower barrier layer 3 becomes larger than or equal to the absolute value of the amount of compressive strain inherent in the quantum dot 4 disposed on the GaAs lower barrier layer 3. Consequently, the InAs quantum dot 4 has no strain or has an elongation strain inherent therein.

Here, the lattice constant or the amount of elongation strain of the side barrier layer 5 is determined on the basis of the lattice constant or the amount of compressive strain of the InAs quantum dot 4, although not limited to this. That is, the lattice constant or the amount of elongation strain of the side barrier layer 5 may be determined on the basis of the lattice constant or the amount of strain of the InAs-containing quantum dot 4. Consequently, a polarization-insensitive gain can be realized.

By the way, the side barrier layer 5 has a band gap larger than the band gap of the InAs quantum dot 4.

The GaAs upper barrier layer 7 is a GaAs-containing barrier layer (second barrier layer), as in the case of the above-described first embodiment. A barrier layer containing GaAs is good enough for the GaAs upper barrier layer 7.

In the present embodiment, the GaAs upper barrier layer 7 has a thickness of, for example, about 30 nm and is disposed in such a way as to cover the other portion (second portion) of the side surface of the InAs quantum dot 4. Consequently, the GaAs upper barrier layer 7 is disposed in such a way as to cover the upper surface and the side surface of the InAs quantum dot 4 and the upper surface of the side barrier layer 5, that is, the upper surface of the quantum dot layer 6.

As described above, in the present embodiment, the elongation strain inherent in the side barrier layer 5 acts on the portion on the bottom side of the quantum dot 4, that is, the portion contributing to the gain of the quantum dot 4 and, thereby, the compressive strain inherent in the quantum dot 4 is canceled. On the other hand, the volume of the upper portion of the quantum dot 4, that is, the portion not contributing to the gain of the quantum dot 4, is small and, therefore, a strain tends to remains locally. Consequently, in order to cancel the strain remaining in this quantum dot 4, the thickness of the GaAs upper barrier layer 7 to cover this is specified to be about 30 nm. In this regard, although relatively large strain is inherent in the side barrier layer 5, the crystallinity is not influenced because the thickness is small.

By the way, in the present embodiment, in order to increase the gain, the active layer 2 has a structure in which the plurality of quantum dot layers 6 including the InAs quantum dot 4 and the BaAs side barrier layer 5 are laminated repeatedly with the GaAs barrier layers 7 and 15 therebetween. The GaAs upper barrier layer 7 is a GaAs lower barrier layer (first barrier layer) relative to the second layer of the quantum dot layer 6. That is, the GaAs upper barrier layer 7 is the upper barrier layer (second barrier layer) relative to the first layer of the quantum dot layer 6 and is the lower barrier layer (first barrier layer) relative to the second layer of the quantum dot layer 6. The same goes for the GaAs barrier layer 15. Furthermore, the GaAs barrier layer 16 is a GaAs upper barrier layer covering the uppermost layer of the quantum dot layer 6. As described above, the active layer 2 has a structure in which the GaAs lower barrier layer (first barrier layer), the quantum dot layer, and the GaAs upper barrier layer (second barrier layer) are laminated repeatedly.

Other configurations are the same as those in the case of the above-described first embodiment and, therefore, explanations thereof are omitted here.

Next, a method of manufacturing the optical semiconductor device according to the present embodiment will be described.

The method of manufacturing the optical semiconductor device according to the present embodiment includes the following operations.

The GaAs-containing lower barrier layer (first barrier layer) 3 is formed above the GaAs-containing substrate 1 (refer to FIG. 8).

The quantum dot 4 having a compressive strain inherent therein, that is, an InAs-containing quantum dot 4 here, is formed on the GaAs-containing lower barrier layer 3 (refer to FIG. 8).

The B-containing side barrier layer 5 having a band gap larger than the band gap of the InAs-containing quantum dot 4 and having an elongation strain inherent therein is formed in such a way as to cover the side surface of the InAs-containing quantum dot 4 (refer to FIG. 8).

The GaAs upper barrier layer (second barrier layer) 7 is formed on the quantum dot 4 and the side barrier layer 5 (refer to FIG. 8).

In particular, in the present embodiment, in order that the active layer 2 has a structure in which the plurality of quantum dot layers 6 are laminated, an operation to form the quantum dot 4, an operation to form the side barrier layer 5, and an operation to form the GaAs upper barrier layer (second barrier layer) are further repeated at least once. Here, the operation to form the quantum dot 4, the operation to form the side barrier layer 5, and the operation to form the GaAs upper barrier layer are repeated a plurality of times (refer to FIG. 8).

A method of manufacturing the quantum dot SOA according to the specific configuration example of the present embodiment will be more specifically described below with reference to FIGS. 9A to 9E.

The MBE method is used for growing each semiconductor layer.

Figure 9A:
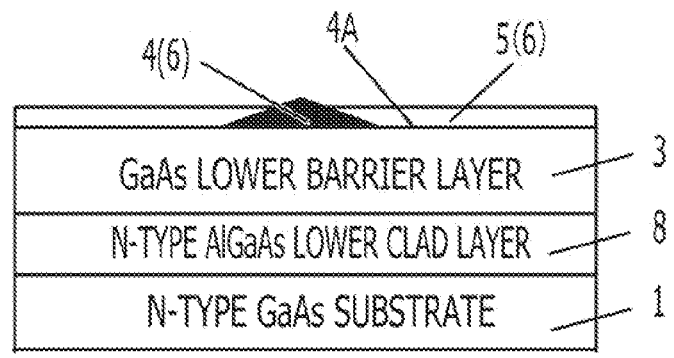
FIGS. 9A to 9E are schematic sectional views for explaining a method of manufacturing the optical semiconductor device according to the third embodiment.

As illustrated in FIG. 9A, the n-AlGaAs lower clad layer 8 is formed on the n-GaAs substrate 1 in a manner similar to that in the case of the above-described first embodiment.

As illustrated in FIG. 9A, the GaAs lower barrier layer 3 is formed on the n-AlGaAs lower clad layer 8.

The InAs quantum dot 4 having a surface density of, for example, about $4 \times 10^{10}$ cm$^{-2}$ is formed on the GaAs lower barrier layer 3 by a self organization method. In the present embodiment, a very thin InAs layer referred to as the wetting layer 4A is formed on the surface to be provided with the InAs quantum dot 4 through self organization.

The BAs side barrier layer 5 is formed in such a way as to cover a part of the side surface of the InAs quantum dot 4. Here, the thickness of the BAs side barrier layer is specified to be the thickness about one-half the height of the quantum dot. In this manner, the first layer of the quantum dot layer 6 including the InAs quantum dot 4 and the BAs side barrier layer 5 is formed.

Figure 9B:
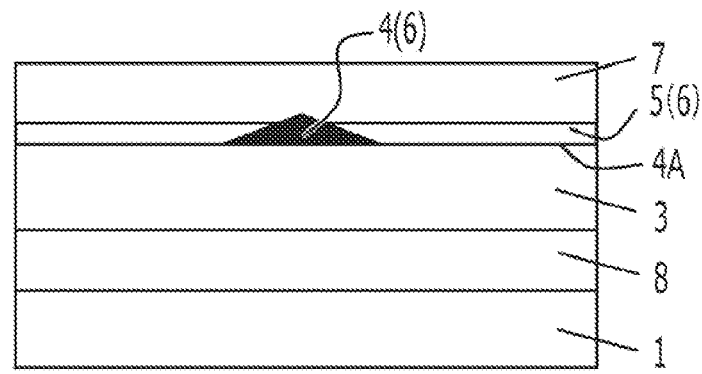

As illustrated in FIG. 9B, the GaAs upper barrier layer 7 is formed on the first layer of the quantum dot layer 6, that is, the InAs quantum dot 4 and the BAs side barrier layer 5, in such a way as to cover them. Here, the thickness of the GaAs upper barrier layer 7 is, for example, about 30 nm.

Figure 9C:
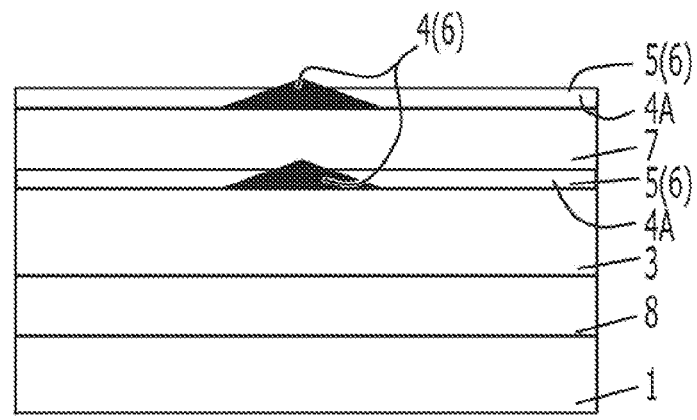
Figure 9D:
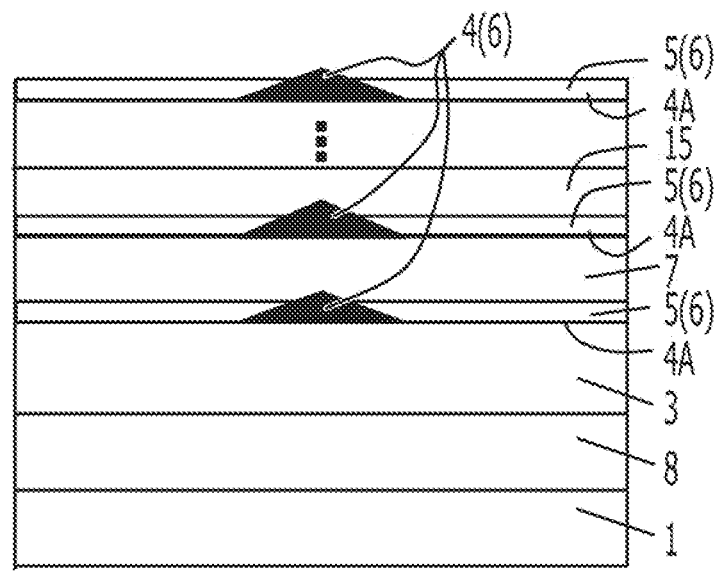

As illustrated in FIG. 9C, the InAs quantum dot 4 is formed on the GaAs upper barrier layer 7 and, thereafter, the BAs side barrier layer 5 is formed, as in the above description. In this manner, the second layer of the quantum dot layer 6 including the InAs quantum dot 4 and the BAs side barrier layer 5 is formed. Subsequently, as illustrated in FIG. 9D, the GaAs upper barrier layer 15 is formed in such a way as to cover the second layer of the quantum dot layer 6. Here, the thickness of the GaAs upper barrier layer 15 is, for example, about 30 nm.

Figure 9E:
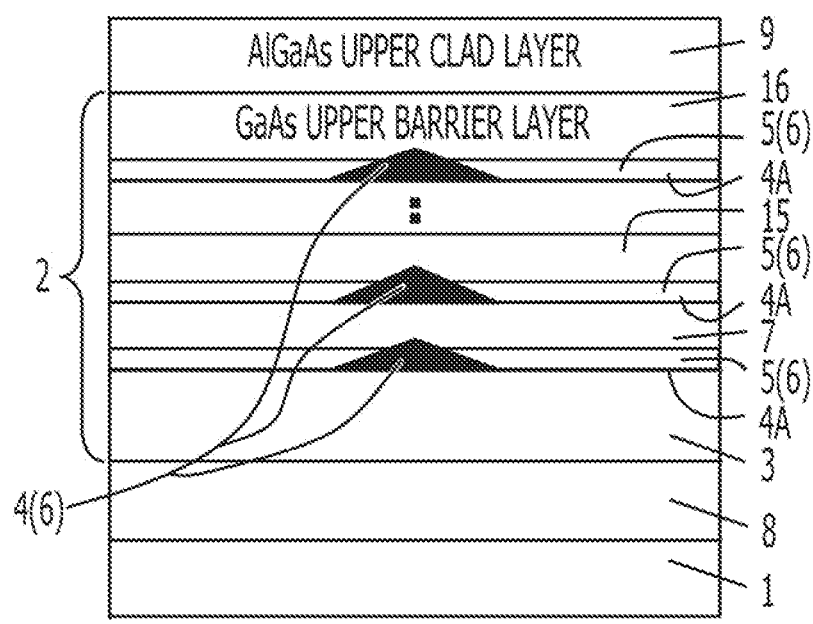

As illustrated in FIGS. 9D and 9E, the above-described operation to form a quantum dot layer 6 and the operation to form the GaAs upper barrier layer are performed repeatedly, so that a plurality of quantum dot layers 6 are laminated. In this manner, the quantum dot active layer 2 is formed having a structure in which the plurality of quantum dot layers 6 are laminated with the barrier layers 7 and 15 therebetween.

In this manner, the quantum dot active layer 2 is formed having a structure in which the quantum dot layer 6 including the GaAs lower barrier layer, the InAs quantum dot 4, and the BAs side barrier layer 5 and the GaAs upper barrier layer are laminated repeatedly on the n-AlGaAs lower clad layer 8.

As illustrated in FIG. 9E, the p-AlGaAs upper clad layer 9 and the p-GaAs contact layer 10 are formed on the GaAs upper barrier layer 16 sequentially (refer to FIG. 8).

After the crystal is grown as described above, working into the element structure of the SOA is performed in a manner similar to that in the case of the above-described first embodiment.

Although not illustrated in the drawing, a SiO$_2$ film is formed, and a ridge waveguide pattern inclined at, for example, about 7° relative to the end surface is formed on the SiO$_2$ film by using, for example, photolithography.

The resulting SiO$_2$ film provided with the ridge waveguide pattern is used as a mask, and the pattern is transferred to the p-GaAs contact layer 10 and the p-AlGaAs upper clad layer 9 through, for example, dry etching. In this manner, a slanting ridge waveguide structure is formed, which includes the p-GaAs contact layer 10 and the p-AlGaAs upper clad layer 9, which has a width of, for example, about 2 μm, and which is inclined at, for example, about 7° relative to the end surface (refer to FIG. 3, for example).

The SiO$_2$ mask, although not illustrated in the drawing, is removed, and the SiO$_2$ film 11 is formed in such a way as to cover the side surface of the ridge waveguide structure and the surface of the p-AlGaAs upper clad layer 9 (refer to FIG. 3, for example). The SiO$_2$ mask may be referred to as a SiO$_2$ film for forming a waveguide pattern. Subsequently, electrodes 12 and 13 for current injection are formed on the upper portion and the lower portion. Although not illustrated in the drawing, nonreflective films are formed on both end surfaces of the element.

The optical semiconductor device and the method of manufacturing the optical semiconductor device according to the present embodiment have an advantage that a polarization-insensitive gain can be obtained easily, as in the case of the above-described first embodiment.

In the present embodiment, in order to increase the gain, the active layer has a structure in which the plurality of quantum dot layers are laminated, although not limited to this. For example, the active layer may be configured to include a single layer of the quantum dot layer.

The present invention is not limited to the specific configurations, conditions, and the like described in each of the above-described embodiments and modified embodiments and can be variously modified within the bounds of not departing from the gist of the present invention.

For example, in each of the above-described embodiments and modified embodiments, the optical semiconductor device disposed on the GaAs substrate 1 is described, although not limited to this. The present invention can be applied to even optical semiconductor devices disposed other substrates insofar as the optical semiconductor device includes an InAs-containing quantum dot disposed on a GaAs-containing barrier layer.

Furthermore, in each of the above-described embodiments and modified embodiments, an undoped quantum dot active layer is used as the quantum dot active layer 2, although not limited to this. For example, the active layer 2 may be formed as a p-type quantum dot active layer in which at least one of the upper barrier layer, the quantum dot including the wetting layer, the lower barrier layer, and the side barrier layer constituting the quantum dot active layer is doped with a p-type impurity. In the case where the S-K quantum dot is used, as in the above-described first embodiment and the third embodiment, for example, a p-type layer doped with a p-type impurity may be included as a part of the side barrier layer or a part of the barrier layer. Moreover, in the case where the columnar coupled quantum dot is used as in the above-described second embodiment, for example, the side barrier layer may be doped with a p-type impurity. Consequently, an improvement of the high temperature characteristic can be expected.

The material and the electrical conductivity of the clad layer and the electrical conductivity of the substrate are not limited to those in each of the above-described embodiments.

For example, in each of the above-described embodiments and modified embodiments, the upper clad layer 9 and the lower clad layer 8 are formed from AlGaAs, although not limited to this, insofar as they are formed from a material which has a refractive index smaller than that of the active layer 2 and which lattice-matches the substrate.

In each of the above-described embodiments and modified embodiments, the explanation is made with reference to disposition on the n-type electrically conductive substrate 1, although not limited to this. For example, disposition on a p-type electrically conductive substrate or a high-resistance substrate may be employed.

In each of the above-described embodiments and modified embodiments, the MBE method is mentioned as the method growing the semiconductor layer, although not limited to this. For example, a metal organic chemical vapor deposition (MOCVD) method may be employed. Alternatively, a plurality of growing methods may be combined. For example, only a quantum dot-containing active layer portion may be grown by the MBE method, and the other portions may be grown by the MOCVD method.

In the above-described first embodiment and the second embodiment, the top portion of the quantum dot 4 is revaporized by the flashing method. However, the flashing method is not necessarily applied, although the uniformity of the quantum dot 4 is reduced. In the above-described third embodiment, the top portion of the quantum dot 4 may be revaporized by the flashing method.

In each of the above-described embodiments and modified embodiments, the waveguide is the slanting waveguide inclined at about 7° relative to the end surface. However, the angle is not limited to this, and as necessary, the waveguide may be perpendicular to the end surface.

In each of the above-described embodiments and modified embodiments, the waveguide structure is specified to be the ridge structure, although not limited to this. For example, a stripe-shaped mesa structure may be employed, and a semiconductor buried-structure, e.g., a pn buried-structure or a high-resistance buried-structure, may be provided. In this regard, the mesa structure may be referred to as a stripe structure.

In each of the above-described embodiments and modified embodiments, a spot size converters may be disposed at both ends of the waveguide. Consequently, the optical coupling efficiency with respect to an optical fiber can be improved.

In each of the above-described embodiments and modified embodiments, the explanation is made with reference to the case where the active layer 2 is used as an active layer of SOA to amplify light, although the use is not limited to the SOA. In this regard, the SOA may be referred to as a semiconductor optical element or a semiconductor element. For example, the active layer 2 may be used as an active layer of an optical semiconductor device, e.g., a photodiode. The photodiode may be referred to as a semiconductor light-receiving element, a light-receiving element, a semiconductor element, or a light-receiving device. Furthermore, optical semiconductor devices, e.g., photodiodes, may be formed by using those having the same structures as the structures of those described in the individual embodiments and modified embodiments in the above description.

An optical signal relay device or an optical signal receiving device can be formed by using the optical amplifying device in each of the above-described embodiments and modified embodiments thereof.

Figure 10:
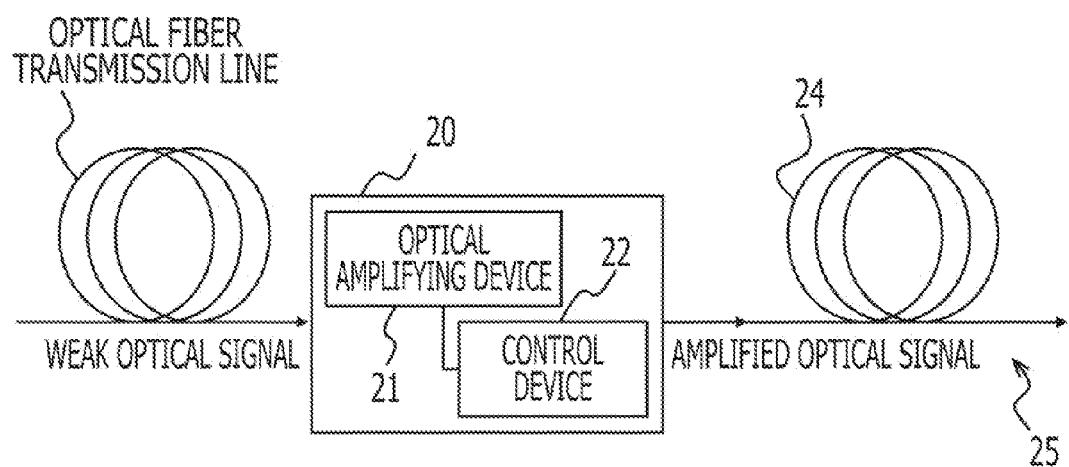
FIG. 10 is a schematic diagram illustrating a configuration example of an optical signal relay device and an optical communication system.

For example, as illustrated in FIG. 10, an optical relay device 20 may be configured to include the optical amplifying device 21 in each of the above-described embodiments and modified embodiments and a control device 22 to control the optical amplifying device 21. In this regard, the relay device may be referred to as a repeater. The input side and the output side of the optical relay device 20 having the above-described configuration are connected to optical fiber transmission lines 23 and 24, respectively, and thereby, an optical communication system 25 is formed. In this case, a weak optical signal input from the optical fiber transmission line 23 on the input side is amplified by the optical signal relay device 20 and is output to the optical fiber transmission line 24 on the output side. In particular, in the case where the optical amplifying device 21 is configured to include a polarization-insensitive quantum dot SOA, it is possible to give a predetermined gain and amplify the input optical signal without depending on the polarization state of the input optical signal.

Figure 11:
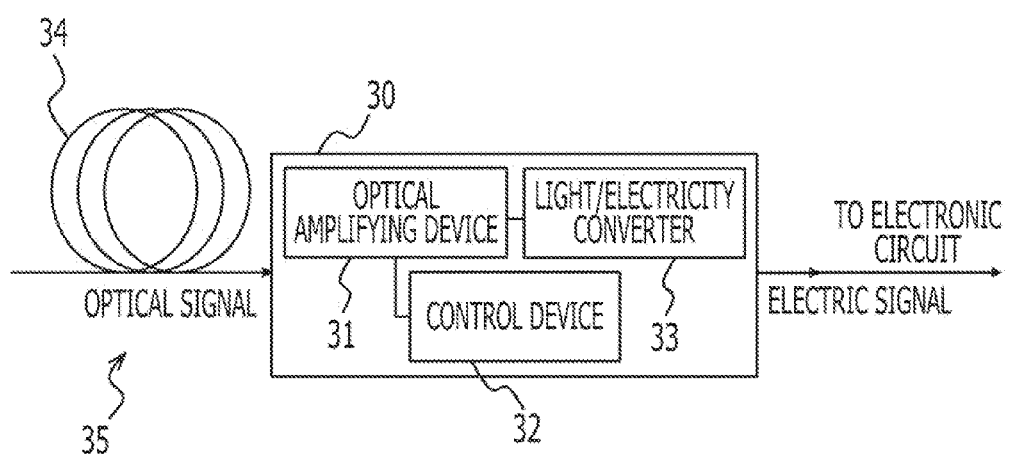
FIG. 11 is a schematic diagram illustrating a configuration example of an optical signal relay device and an optical communication system.

As illustrated in, for example, FIG. 11, an optical signal receiving device 30 may be configured to include the optical amplifying device 31 in each of the above-described embodiments and modified embodiments, a control device 32 to control the optical amplifying device 31, and a light/electricity converter 33 to convert an optical signal from the optical amplifying device 31 to an electric signal. The optical signal receiving device 30 having the above-described configuration is connected to an optical fiber transmission line 34 and thereby, an optical communication system 35 is formed. In this case, an optical signal input from the optical fiber transmission line 34 is received by the optical signal receiving device 30, is amplified by the optical amplifying device 31 and, is converted to an electric signal by the light/electricity converter 33. Subsequently, the electric signal output from the optical signal receiving device 30 is transferred to an electronic circuit. In particular, in the case where the optical amplifying device 31 is configured to include a polarization-insensitive quantum dot SOA, it is possible to give a predetermined gain and amplify the received optical signal without depending on the polarization state of the received optical signal. In this optical signal receiving device 30, the light/electricity converter 33 may be formed by applying the active layer in each of the above-described embodiments and modified embodiments. In this case, the received optical signal can be converted to an electric signal without depending on the polarization state of the received optical signal.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments in accordance with aspects of the present invention have been described in detail, it should be understood that various changes, substitutions, and alterations could be made hereto without departing from the spirit and scope of the invention.

What is claimed is:

1. An optical semiconductor device comprising:
    a substrate; and
    an active layer disposed on the substrate,
    wherein the active layer includes a first barrier layer containing GaAs, a quantum dot layer, which is disposed on the first barrier layer, which includes a quantum dot containing InAs, which includes a side barrier layer which covers at least a part of the quantum dot and a side surface of the quantum dot, and having an elongation strain inherent therein, and a second barrier layer disposed on the quantum dot layer,
    wherein the quantum dot layer is doped to become a p-type.

2. The optical semiconductor device according to claim 1, wherein an absolute value of the difference in lattice constant between the first barrier layer and the side barrier layer is larger than or equal to an absolute value of the difference in lattice constant between the first barrier layer and the quantum dot.

3. The optical semiconductor device according to claim 1, wherein the side barrier layer further comprises a group V element.

4. The optical semiconductor device according to claim 1, wherein the side barrier layer comprises at least one material selected from the group consisting of BAs, BGaAs, BInAs, BGaInAs, BGaP, BGaAsP, BAsSb, BGaAsSb, BInAsSb, BGaInAsSb, BGaPSb, and BGaAsPSb.

5. The optical semiconductor device according to claim 1, wherein the side barrier layer comprises $B_xGa_{1-x}As$ (where $0.46 \leq x \leq 1$).

6. The optical semiconductor device according to claim 1, wherein the side barrier layer has a lattice constant of 5.25 .ANG. or less.

7. The optical semiconductor device according to claim 1, wherein the side barrier layer has a thickness smaller than or equal to the height of the quantum dot.

8. The optical semiconductor device according to claim 1, wherein a plurality of the quantum dot layers are disposed between the first barrier layer and the second barrier layer and the quantum dot layers are laminated such that the quantum dots are in contact with each other vertically.

9. The optical semiconductor device according to claim 1, wherein the first barrier layer, the quantum dot layer, and the second barrier layer are laminated repeatedly in the active layer.

10. A method of manufacturing an optical semiconductor device comprising:
    forming a first barrier layer containing GaAs on a substrate;
    forming a quantum dot having a compressive strain inherent therein on the first barrier layer;
    forming a side barrier layer, which has a band gap larger than the band gap of the quantum dot, which has an elongation strain inherent therein, and which contains B, so as to cover at least a part of a side surface of the quantum dot; and
    forming a second barrier layer on the quantum dot and the side barrier layer,
    wherein the quantum dot is doped to become a p-type.

11. The method of manufacturing an optical semiconductor device according to claim 10, wherein an absolute value of the amount of elongation strain inherent in the side barrier layer is larger than or equal to an absolute value of the amount of compressive strain inherent in the quantum dot.

12. The method of manufacturing an optical semiconductor device according to claim 10, wherein
    before the forming of the second barrier layer,
    a quantum dot layer including coupled quantum dots is formed by repeating the forming of the quantum dot and the forming of the side barrier layer a plurality of times.

13. The method of manufacturing an optical semiconductor device according to claim 12, wherein
    the forming of the first barrier layer, the forming of the quantum dot layer including coupled quantum dots, and the forming of the second barrier layer are repeated a plurality of times.

14. The method of manufacturing an optical semiconductor device according to claim 10, wherein
    the forming of the quantum dot, the forming of the side barrier layer, and the forming of the second barrier layer are repeated a plurality of times.

15. The method of manufacturing an optical semiconductor device according to claim 10, wherein
    the upper portion of the quantum dot is substantially flattened after the side barrier layer is formed.

* * * * *